US006028813A

United States Patent [19]
Choi

[11] Patent Number: 6,028,813
[45] Date of Patent: Feb. 22, 2000

[54] NOR TYPE SEMICONDUCTOR MEMORY DEVICE AND A METHOD FOR READING DATA STORED THEREIN

[75] Inventor: Byeng-sun Choi, Kyunggi-do, Rep. of Korea

[73] Assignee: Samsung Electronics, Co., Ltd., Suwon, Rep. of Korea

[21] Appl. No.: 09/059,680

[22] Filed: Apr. 13, 1998

[30] Foreign Application Priority Data

Apr. 12, 1997 [KR] Rep. of Korea ....................... 97-13512

[51] Int. Cl.[7] ........................................................ G11C 8/00
[52] U.S. Cl. .................................. 365/230.04; 365/230.03
[58] Field of Search .......................... 365/230.08, 230.03, 365/230.04

[56] References Cited

U.S. PATENT DOCUMENTS 5,650,979 7/1997 Komarek et al. ..................... 365/233.5
5,793,698 8/1998 Komarek et al. .................... 365/230.08

OTHER PUBLICATIONS

"16Mb Rom Design Using Bank Select Architecture" M. Okada et al. Integrated Circuits group, Sharp Corporation 2613–1, Ichinomoto, Teni, Nara 632, Japan.

*Primary Examiner*—David Nelms
*Assistant Examiner*—M. Tran
*Attorney, Agent, or Firm*—Marger Johnson & McCollom, PC

[57] ABSTRACT

Disclosed is a semiconductor memory device and a method for reading data stored therein. The device comprises a cell array having a plurality of groups, sub-bit lines, word lines, main bit lines, each of the groups having memory cells connected in parallel between the sub bit lines, first NMOS transistors for selecting even-numbered groups of the groups, second NMOS transistors for selecting odd-numbered groups of the groups, a voltage generating circuit for generating a first voltage by dividing an externally applied power supply voltage, a row selecting circuit for selecting one of the word lines in response to an external row address signal; a column selecting circuit for selecting column of the cell array in response to an external column address signal, and a sense amplifier circuit for sensing the data of memory cell associated with the selected word line and the selected main bit line. The method comprising the steps of precharging the main bit lines to the first voltage; and sensing the data of memory cell associated to the selected word line and the selected main bit line by suppling the first voltage onto the main bit lines and the selected word line, and suppling a second voltage to at least one of the main bit lines adjacent to the selected main bit line in response to the column address signal. A voltage level applied on a selected word line during a data sensing operation is equal to a voltage applied on all the main bit lines during bit line precharge operation. Alternatively, the voltage level applied on the selected word line is lower than the voltage level applied on the main bit lines. Thus, a voltage difference between respective gates and sources of the cells adjacent to the selected memory cell is 0 V, so that all of the cells are turned off during the data sensing period.

18 Claims, 12 Drawing Sheets

NOR TYPE SEMICONDUCTOR MEMORY DEVICE AND A METHOD FOR READING DATA STORED THEREIN

FIELD OF THE INVENTION

The present invention relates to a semiconductor memory device and, in particular, to a NOR type semiconductor memory device having a plurality of memory cells for storing single bit data or multi-bit data and a method for reading the data stored therein.

BACKGROUND OF THE INVENTION

FIG. 1 is a diagram of a memory array for a conventional NOR type semiconductor memory device. FIG. 2 is a timing diagram of a data reading operation for the memory device shown in FIG. 1. The memory device shown in FIG. 1 refers particularly to a mask read only memory (hereinafter referred to as a "mask ROM") having a plurality of NOR type memory cells. The hierarchical bit line system of the array having NOR structured memory cells is described in detail in a paper entitled "16 Mb ROM Design Using Bank Select Architecture," pp. 85–86, Digest of Technical Papers, VLSI Circuit Symposium held in Tokyo, Japan, August 1988, incorporated herein by reference.

Referring to FIG. 2, the data reading operation of the NOR type mask ROM shown in FIG. 1 is divided into three periods: a bit line precharge period 1, a data sense period 2, and a data output period 3. During the bit line precharge period 1, all main bit lines MBL0 to MBLi are precharged to a precharge voltage Vpre (e.g., 1 V to 2 V) to read the data stored in an addressed memory cell. The data sense period 2 begins when the main bit lines are precharged and the precharge operation ends. During the data sense period 2, the NOR device detects whether the addressed memory cell is an on-cell or an off-cell. Namely, the NOR device senses a voltage level on a main bit line associated with the addressed memory cell. During the data output period 3, the data sensed during the data sense period 2 is provided to external circuitry.

The data reading operation will be described in detail with reference to FIG. 2. Assume a j-th block of a plurality of array blocks 110 within memory cell 100 is selected. The subscript j indicates a j-th array block but does not indicate a plurality of signs. During the precharge period 1 of the data reading operation, ground potential (i.e., 0 V) is applied to word lines WL0 to WLm and even-numbered and odd-numbered bank selection signals SEj and SOj, respectively, and a precharge voltage Vpre is applied to the main bit lines MBL0 to MBLi where i is an integer. During the data sense period 2, the voltage level of the even-numbered bank selecting signal SEj and the voltage level of an addressed or selected word line WL0 increases from the ground potential to a power supply voltage VCC.

As shown in FIG. 2, the data stored in a memory cell corresponding to the selected word line WL0 and a selected main bit line MBL1 is detected by a sense amplifier circuit SA. If the addressed memory cell is an on-cell, the selected main bit line has a voltage level lower than the precharge voltage Vpre because of the current flowing through the current path thereof (the on-cell operates as a current sink). On the other hand, if the addressed memory cell is an off-cell, the voltage level of the selected main bit line MBL1 is maintained at the precharge voltage Vpre. Then, the sense amplifier circuit SA senses the voltage level on the selected main bit line MBL1 and provides the data sensed to external circuitry during output period 3.

Suppose that a memory cell M00 associated with the word line WL0, the main bit line MBL1, and the even-numbered bank selection signal SEj are selected and read using the above-mentioned data reading method. Suppose also that the selected memory cell M00 is an off-cell and that the memory cells M01, M02, M03, and M04 are commonly connected to the selected word line WL0, adjacent to the cell M00 and are on-cells. Under these conditions, during the data sense period 2, the voltage Vpre applied to the selected main bit line MBL1 during the precharge period 1 is discharged into an adjacent main bit line MBL2 via the memory cells M01 and M02 connected to the same word line WL0. As a result, the sensing margin and the reading speed for the selected memory cell M00 (e.g., the off-cell) drops off.

SUMMARY OF THE INVENTION

It is therefore an object of the present invention to provide a NOR type semiconductor memory device that overcomes the problems associated with prior art NOR type semiconductor memory devices.

It is another object of the present invention to provide a NOR type semiconductor memory device for improving the sensing margin and the reading speed of data stored in an off-cell that stores single bit or multi-bit data.

It is yet another object of the present invention to provide a method for reading data stored in the off-cell of a NOR type semiconductor memory device.

According to one aspect of the present invention, there is provided a NOR type semiconductor memory device comprising a plurality of word lines extending in a first direction, a plurality of first bit lines extending in a second direction, a plurality of second bit lines extending in the second direction, and a plurality of data lines corresponding to the plurality of first bit lines. The memory device further comprises a cell array divided into a plurality of blocks, each block having a plurality of memory cells corresponding to the plurality of word lines, each memory cell connected in parallel between pairs of second bit lines, a means for selecting even-numbered blocks in response to a first selection signal, and a means for selecting odd-numbered blocks in response to a second selection signal. The device further comprises a means for generating a first voltage by dividing an externally applied power supply voltage, an address buffer for converting an external address signal having a TTL logic level into a row and a column address signals having a CMOS logic level, and a means for selecting one of the plurality of word lines in response to the row address signal, supplying the first voltage to the selected word line and generating the first and second selection signals. The memory device further comprises a means for selecting columns of the cell array and generating a column selection signal and a plurality of bit line selection signals in response to the column address signal, a switching means for electrically coupling a first bit line selected by one of the plurality of bit line selection signals with a corresponding data line in response to the column selection signal, and a means for sensing data stored in a memory cell associated with the selected first bit line and the selected word line. The means for sensing data supplies the first voltage to the plurality of first bit lines in response to the bit line selection signals during a bit line precharge period, supplies the first voltage to the plurality of first bit lines during a data sensing period, and supplies a second voltage to at least one of the plurality of first bit lines adjacent to the selected first bit line, the first voltage being equal to or lower than the second voltage.

According to another aspect of the present invention, a NOR type semiconductor memory device, comprises a plurality of word lines extending in a row direction, a plurality of first bit lines extending in a column direction, a plurality of second bit lines extending in the column direction, and a plurality of data lines corresponding to the plurality of first bit lines. The device further comprises a cell array having a plurality of banks, each bank including a plurality of memory cells corresponding to the plurality of word lines and coupled to the plurality of second bit lines and means for selecting even-numbered banks of the plurality of banks in response to a first selection signal, the means for selecting even-numbered banks including a first plurality of NMOS transistors, each NMOS transistor of the first plurality of NMOS transistors having a gate for receiving the first selection signal and a current path coupled between a corresponding first bit line of the plurality of first bit lines and an upper end of a corresponding second bit line of the plurality of second bit lines. The device comprises means for selecting odd-numbered banks of the plurality of banks in response to a second selection signal, the means for selecting odd-numbered banks including a second plurality of NMOS transistors, each NMOS transistor of the second plurality of NMOS transistors having a gate for receiving the second selection signal and a current path coupled between a corresponding first bit line of the plurality of first bit lines and a lower end of a corresponding second bit line of the plurality of second bit lines, means for generating a first voltage by dividing an externally applied power supply voltage, the first voltage being equal to or lower than a second voltage, the second voltage being equal to the power supply voltage minus a threshold voltage of any of the first or second plurality of NMOS transistors, and means for selecting one of the plurality of word lines in response to an externally applied row address signal, supplying the first voltage to the selected word line, and alternately generating the first and second selection signals to select the even-numbered or odd-numbered banks during a reading operation. The device further comprises means for selecting a first bit line from the plurality of first bit lines in response to a column address signal and means for supplying the first voltage to the plurality of first bit lines, supplying a third voltage to at least one of the second bit lines adjacent to the selected first bit line, and sensing data from a memory cell associated with the selected word line and the selected first bit line.

According to a further aspect of the present invention, a NOR type semiconductor memory device comprises a plurality of word lines extending in a first direction, a plurality of first bit lines extending in a second direction, a plurality of second bit lines extending in the second direction, and a cell array divided into a plurality of banks, each bank having a plurality of memory cells corresponding to the plurality of word lines, each memory cell being connected in parallel between pairs of second bit lines and operating in a first, second, third, or fourth state corresponding to a first, second, third, or fourth threshold voltage, respectively. The device further comprises a plurality of first NMOS transistors for selecting even-numbered banks in response to a first selection signal, a plurality of second NMOS transistors for selecting odd-numbered banks in response to a second selection signal, means for generating a first voltage by dividing an externally applied power supply voltage, and means for generating a second voltage having at least three voltage levels in response to control signals, the three voltage levels varying in a predetermined voltage range. The device further comprises means for selecting one of the plurality of word lines in response to a row address during a reading operation and supplying the first voltage to the selected word line, means for selecting a first bit line in response to a column address signal, and means for supplying the first voltage to the plurality of first bit lines, supplying the second voltage to at least one of first bit lines adjacent to the selected first bit line associated with the selected word line, and sensing data stored in a memory cell corresponding to the selected word line and first bit line during a reading operation.

According to an additional aspect of the present invention, a method for reading data stored in a NOR type semiconductor memory device is provided. The memory device comprises a plurality of sub-bit lines, a plurality of word lines, a plurality of main bit lines, a cell array having a plurality of banks, each bank having a plurality of memory cells connected in parallel between the sub-bit lines, a plurality of first NMOS transistors for selecting even-numbered banks, and a plurality of second NMOS transistors for selecting odd-numbered banks, a voltage generating circuit for generating a first voltage by dividing an externally applied power supply voltage. The device further comprises a row selecting circuit for selecting one of the word lines in response to an external row address signal, a column selecting circuit for selecting a main bit line in response to an external column address signal, and a sense amplifier circuit for sensing the data stored in a memory cell associated with the selected word line and the selected main bit line. The method comprises precharging the main bit lines to the first voltage and sensing the data stored in the memory cell associated with the selected word line and the selected main bit line by providing the first voltage to the plurality of main bit lines and the selected word line and providing a second voltage to at least one of the main bit lines adjacent to the selected main bit line in response to the column address signal.

As is apparent from the foregoing, according to the NOR type mask ROM of the invention, a voltage level applied on a selected word line during data sensing operation is equal to a voltage applied on all the main bit lines during bit line precharge operation. Alternatively, the voltage level applied on the selected word line is lower than the voltage level applied on the main bit lines. As a result, a voltage difference between respective gates and sources of the cells adjacent to the selected memory cell is 0 V, so that all of the cells are turned off during the data sensing period. By sensing an off-cell data according to the present invention, the off-cell sensing margin can be ensured and the NOR type mask ROM realizes a high speed data sensing operation.

BRIEF DESCRIPTION OF THE DRAWINGS

The foregoing and other objects, features, and advantages of the invention will become more readily apparent from the following detailed description of a preferred embodiment that proceeds with reference to the following drawings.

DETAILED DESCRIPTION OF THE PREFERRED EMBODIMENTS

It should be understood that the description of the preferred embodiments is merely illustrative and that it should not be read in a limiting sense. In the following detailed description, several specific details are set forth in order to provide a thorough understanding of the present invention. It will be obvious to one skilled in the art, however, that the present invention may be practiced without these specific details.

The device and method in accordance with the preferred embodiments of the present invention will be described in detail with reference to the accompanying FIGS. 3–12.

1. First Embodiment

Figure 3:
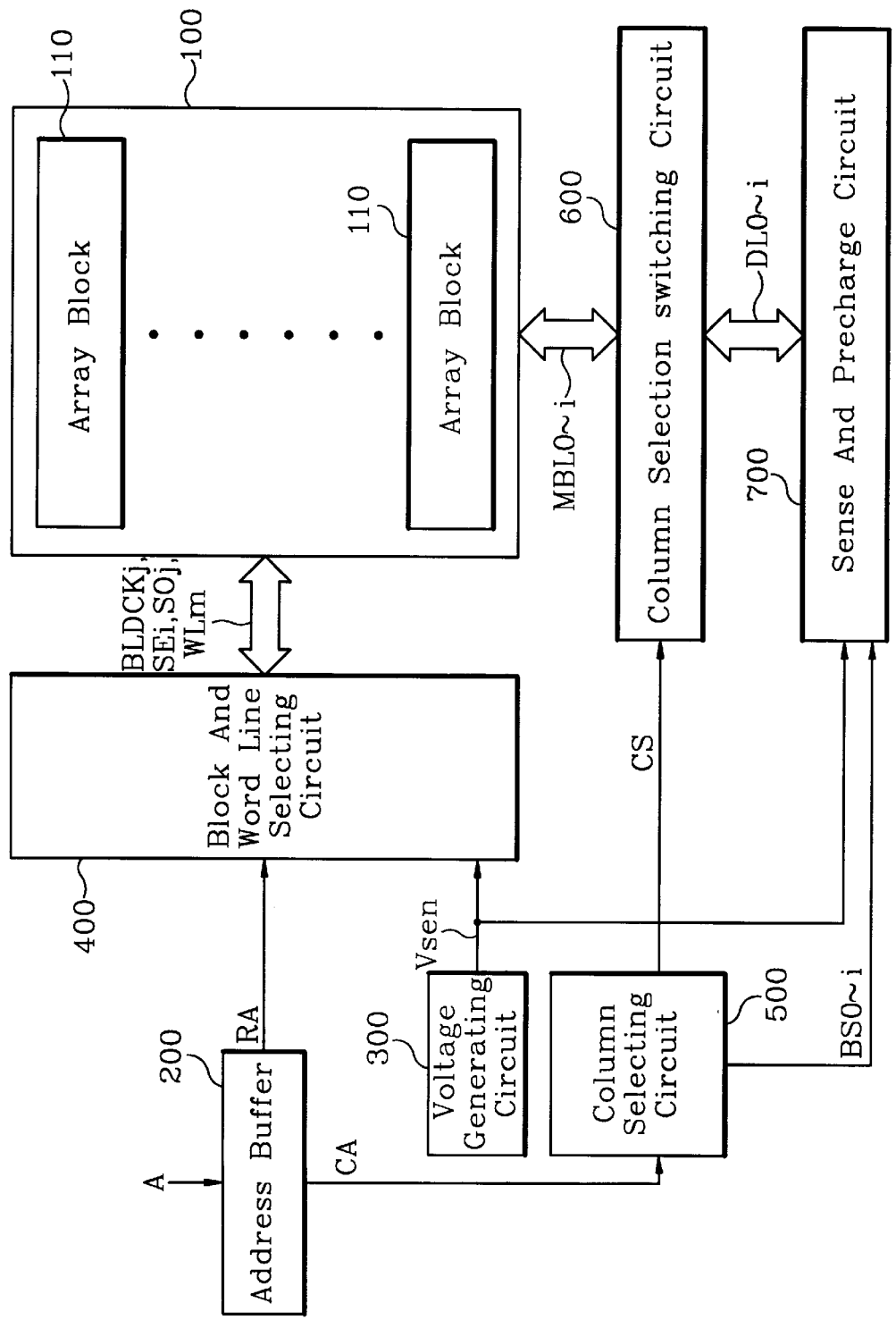
FIG. 3 is a block diagram of a NOR type semiconductor memory device according to a first embodiment for the present invention.

FIG. 3 is a circuit diagram of a NOR type semiconductor memory device according to a first preferred embodiment of the present invention. Referring to FIG. 3, the NOR type semiconductor memory device and, in particular, the NOR type mask read only memory, comprises a memory cell array 100, an address buffer circuit 200, a voltage generating circuit 300, a block and word line selecting circuit 400, a column selecting circuit 500, a column selection switching circuit 600, and a sense/precharge circuit 700. The memory cell array 100 has a plurality of array blocks 110 divided in rows, each of the array blocks 110 having a plurality of NOR type memory cells (not shown). The address buffer 200 converts an external address A having a TTL voltage level into a row and a column address signals RA and CA, respectively, having CMOS voltage levels. The voltage generating circuit 300 generates a sensing voltage Vsen. The sensing voltage Vsen is obtained by dividing down a power supply voltage VCC. The sensing voltage Vsen is equal to or lower than VCC-Vth where VCC is the power supply voltage and Vth is the threshold voltage of any of the bank selection transistors 10 or 12 shown in FIG. 4 within an array block 110.

Responsive to the row address signal RA, the block and word line selecting circuit 400 generates a block selection signal BLOCKj. The block selection signal BLOCKj selects one of the array blocks 110 and selects one of a plurality of word lines WLm in the selected array block. Furthermore, the block and word line selecting circuit 400 supplies the sensing voltage Vsen to the selected word line WLm and generates selection signals SEj and SOj that select alternatively between the even-numbered and odd-numbered banks in memory cell array 100.

The column select circuit 500 selects a plurality of columns in the memory cell array 100. The column selecting circuit 500 generates a control signal CS and a plurality of bit line selection signals BS0 to BSi (where i is an integer) responsive to the column address CA. The column selection switching circuit 600 allows the connection of a plurality of main bit lines MBL0 to MBLi coupled to the memory cell array 100 with a plurality of data lines DL0 to DLi corresponding to the main bit lines MBL0 to MBLi, respectively.

The sense/precharge circuit 700 precharges the main bit lines MBL0 to MBLi to the sensing voltage Vsen responsive to the bit line selection signals BS0 to BSi generated during the bit line precharge operation. The circuit 700 also supplies the sensing voltage Vsen to selected and unselected main bit lines during the data sensing operation. Also, the circuit 700 senses the data stored in an arbitrarily addressed memory cell at the data sensing point (refer to FIG. 7) by supplying ground potential (0 V) to the adjacent main bit line (e.g., MBL0) corresponding to the selected main bit line (e.g., MBL1).

Figure 1:
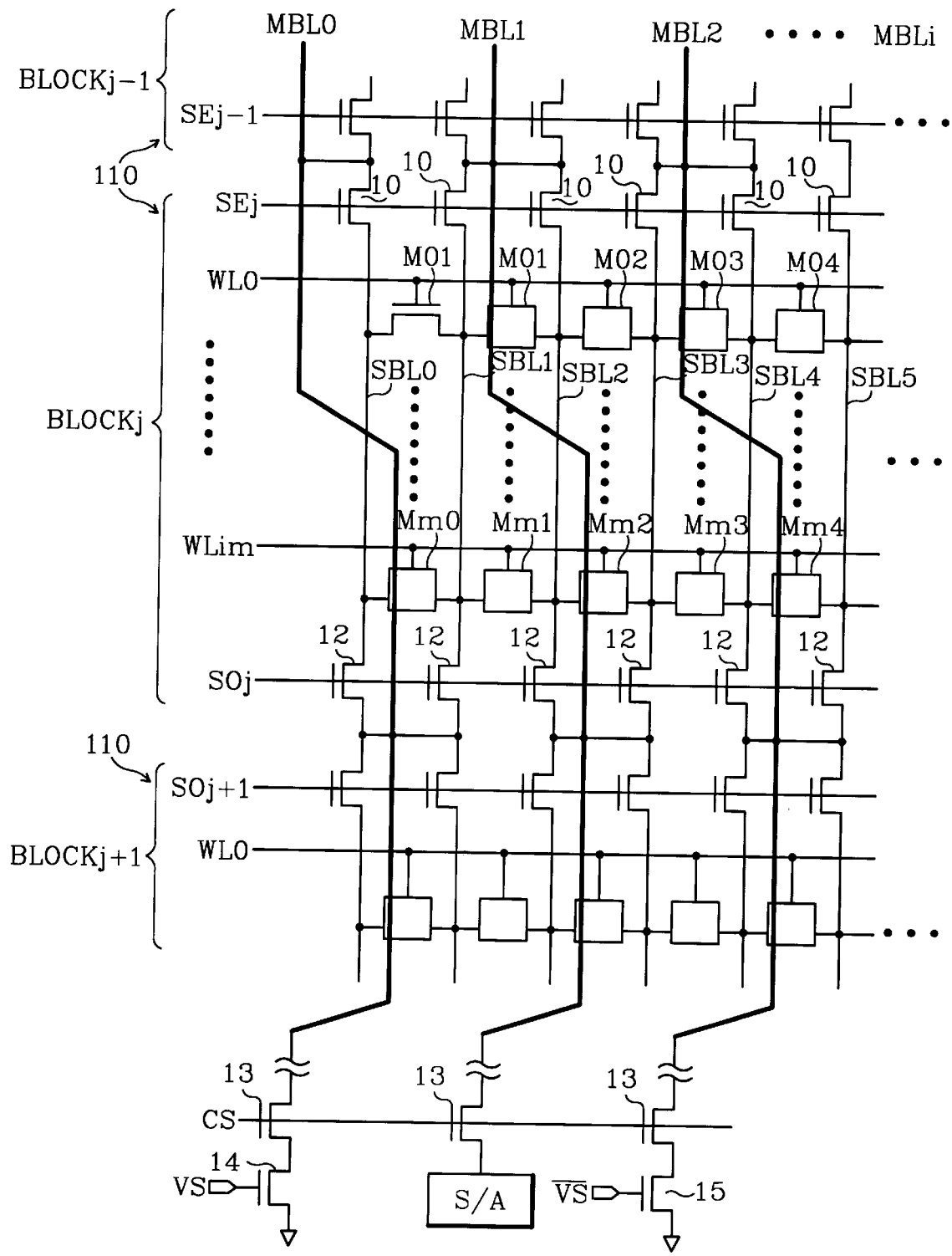
FIG. 1 is a circuit diagram of a memory cell array for a conventional NOR type semiconductor memory device.
Figure 4:
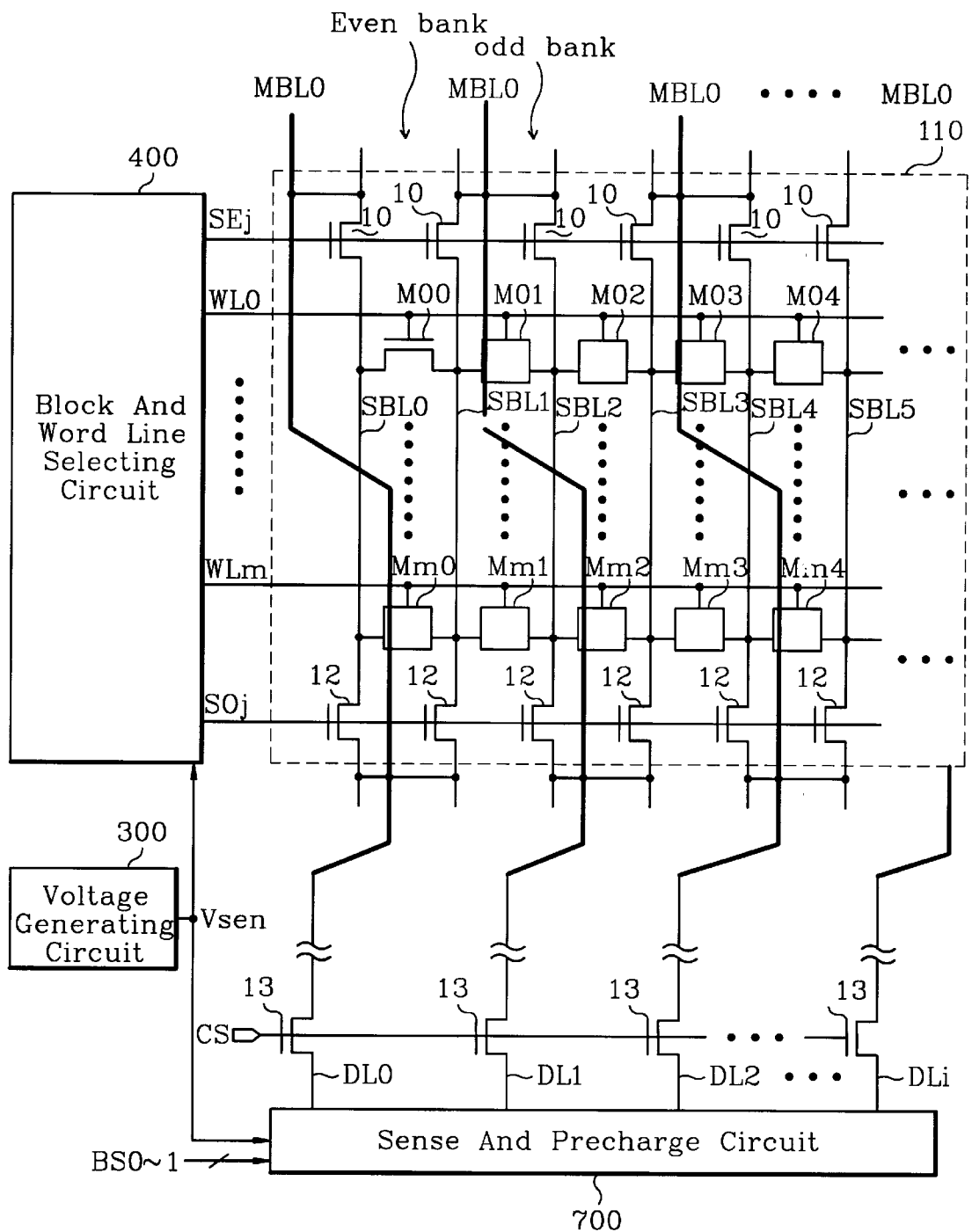
FIG. 4 is a detailed circuit diagram of the memory cell array and the peripheral blocks for the memory device shown in FIG. 3.

FIG. 4 shows the combination of the memory cell array and the peripheral circuit blocks for the memory device shown in FIG. 3. For simplicity, only a j-th array block of a plurality of blocks 110 is illustrated in FIG. 4, but other memory blocks have the same construction as that shown in FIG. 1 and described in the above-mentioned paper.

Referring to FIG. 4, the j-th array block 110 comprises a plurality of word lines WL0 to WLm, a plurality of sub-bit lines SBL0 to SBLk (where k is integer), a plurality of main bit lines MBL0 to MBLi, and a plurality of even-numbered and odd-numbered banks. Each of the banks comprises a plurality of memory cells M0n to Mmn (where m and n are integers) arranged in parallel between the sub-bit lines SBL0 to SBLk. The memory cells M0n to Mmn corresponding to respective columns are composed of NMOS transistors that, in turn, correspond to the word lines WL0 to WLm. Each of the NMOS transistors has a gate connected to a corresponding one of the word lines WL0 to WLm and a current path formed between both cross-coupled portions of the word lines WL0 to WLm and the sub-bit lines SBL0, SBL2, . . . , SBLk (where k is integer). Each of the main bit lines MBL0 to MBLi is coupled to the upper end of each of the sub-bit lines SBL0 to SBLk via each of the even-numbered bank selection transistors 10 commonly controlled by the even-numbered bank selection signal SEj. Each of the main bit lines MBL0 to MBLi is connected to the lower end of each of the sub-bit lines SBL0 to SBLk via each of the odd-numbered bank selection transistors 12 commonly controlled by an odd-numbered bank selection signal SOj.

The second and third sub-bit lines SBL1 and SBL2 are connected to the second main bit line MBL1 via the corresponding even-numbered bank selection transistors 10. Fourth and fifth sub-bit lines SBL3 and SBL4 are connected to the third main bit line MBL2 via the corresponding even-numbered bank selection transistors 10. Similarly, the third and fourth sub-bit lines SBL2 and SBL3 are coupled to the second main bit line MBL1 via the corresponding odd-numbered bank selection transistors 12. The fifth and sixth sub-bit lines SBL4 and SBL5 are connected to the third main bit line MBL2 via the corresponding odd-numbered bank selection transistors 12. As shown in FIG. 4, the main bit lines MBL0 to MBLi are arranged over the array block 110 in a zigzag manner.

It should be obvious to those skilled in the art that the above-mentioned method can be applied to all the array blocks 110 within the array 100 and that each of the main bit lines MBL0 to MBLi is coupled to the respective data lines DL0 to DLi through NMOS transistors 13 controlled by the control signal CS.

Figure 5A:
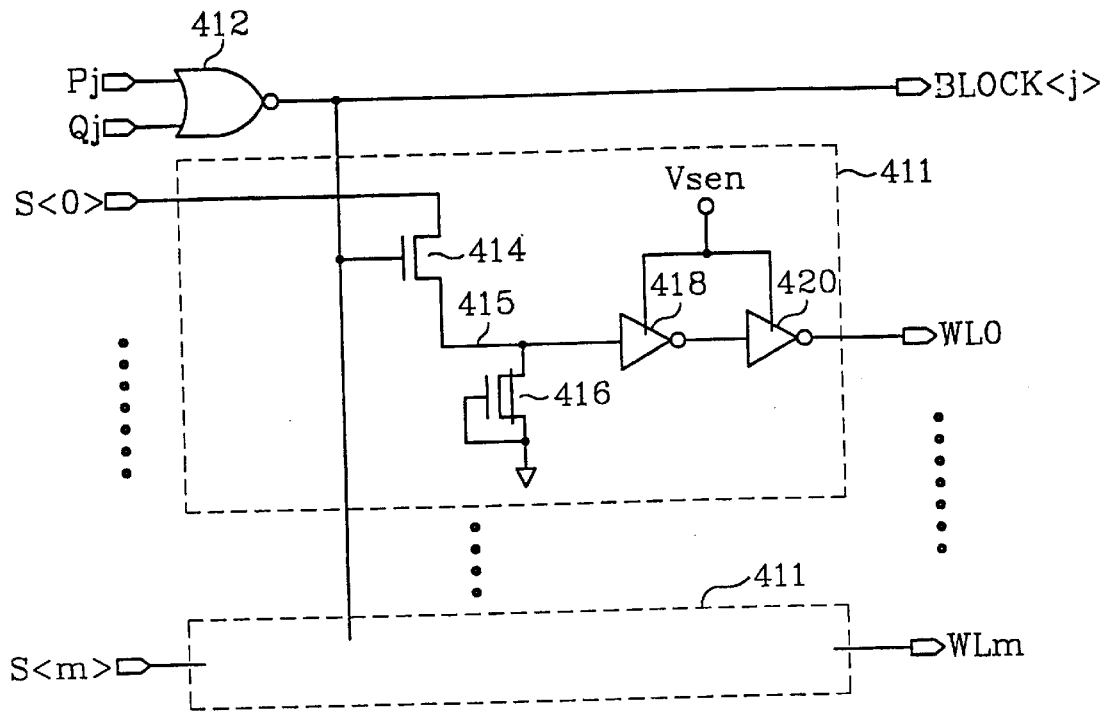
FIGS. 5A and 5B are detailed circuit diagrams of the block/word line selecting circuit for the memory device shown in FIG. 3.
Figure 5B:
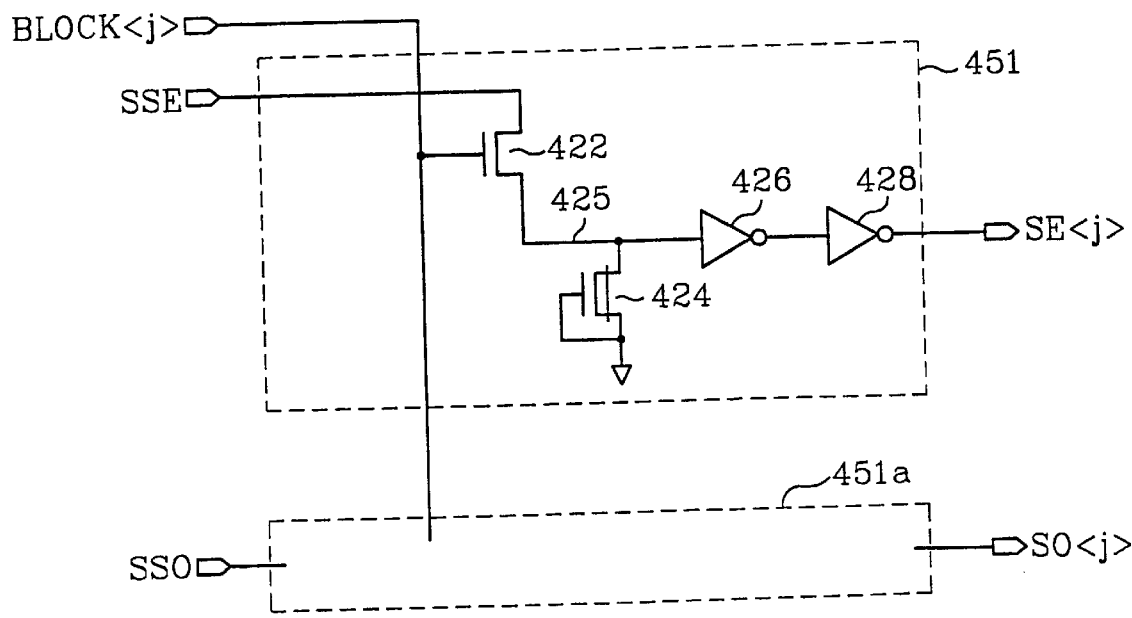

FIGS. 5A and 5B are circuit diagrams of the block/word line selecting circuit 400 shown in FIG. 3. The block/word line selecting circuit 400 is composed of a word line driving circuit 410 (FIG. 5A) and a bank selecting circuit 450 (FIG. 5B). The word line driving circuit 410 receives a plurality of word line selection signals S0 to Sm and Pj and associated with a j-th array block and a sense voltage Vsen. The circuit 410 generates a block selection signal BLOCKj that is used to select one of the array blocks 110 and to drive one of the word lines WL0 to WLm within the selected array block with the sensing voltage Vsen. The word line driving circuit 410 is comprised of a NOR gate 412 and a plurality of driving circuits 411 corresponding to the word line selection signals S0 to Sm, respectively. The NOR gate 412 receives the signals Pj and Qj and selects an arbitrary array block associated with the signals Pj and Qj. When the signals Pj and Qj are simultaneously applied at a logic low level, e.g., 0 V, an array block associated with the signals Pj and Qj is selected. If an arbitrary array block is selected, the block selection signal BLOCKj changes to a logic high level from low level.

FIG. 5A shows in detail only one of the plurality of driving circuits 411 for simplicity. In this figure, the driving circuit 411, to which an word line selection signal S0 is applied, comprises an enhancement type NMOS transistor 414, a depletion type NMOS transistor 416, and two inverters 418 and 420. The transistor 414 has a drain for receiving the word line selection signal S0, a source connected to a node 415, and a gate connected to output of the NOR gate 412. The transistor 416 has a gate connected to ground and a current path formed between the node 415 and ground. The inverters 418 and 420 are connected in series between the node 415 and a word line WL0 corresponding to the word line selection signal S0. Furthermore, the sensing voltage Vsen is commonly supplied to the inverters 418 and 420 as a power supply voltage.

If an arbitrary j-th array block is selected by the NOR gate 412, namely a block selection signal BLOCKj corresponding to j-th array block is output at a logic high level from NOR gate 412, the NMOS transistor 414 is activated. If a word line selection signal S0 is selected at a high level, the node 415 is at high level, so that the word line WL0 is driven with the sensing voltage Vsen through the inverters 418 and 420. At the same time, since other word line selection signals S1 to Sm are at a logic low level(e.g., 0 V), word lines WL1 to WLm corresponding to the signals S1 to Sm are maintained at 0 V.

Referring again to FIG. 5B, the bank selecting circuit 450 is comprised of a pair of driving circuits 451 and 451a, the driving circuit 451 for choosing the even-numbered banks and the driving circuit 451a for choosing the odd-numbered banks within an arbitrarily selected array block. For simplicity, only the driving circuit 451 for selecting the even-numbered banks is illustrated, but the driving circuit 451a also has the same configuration as the driving circuit 451. The driving circuit 451 supplies the power supply voltage to an even-numbered bank selection line SEj responsive to both the block selection signal BLOCKj corresponding to the j-th array block and an external even-numbered bank selection signal SSE.

The driving circuit 451 is composed of an enhancement type NMOS transistor 422, a depletion type NMOS transistor 424, and two inverters 426 and 428. The transistor 422 has a drain for receiving the even-numbered bank selection signal, a source connected to node 425, and a gate for receiving the block selection signal BLOCKj. The transistor 424 has a current path formed between the node 425 and ground and a gate connected to ground. The inverters 426 and 428 are connected in series between the node 425 and the even-numbered bank selection line SEj corresponding to the even-numbered bank selection signal SSE.

Notably, the power supply voltage VCC is applied to an odd-numbered bank selection line SOj while the sensing voltage Vsen is applied to the word lines WL0 to WLm and one of the bank selection signals SSE and SSO is at a logic high level while the other is at a logic low level. In addition, since the circuits for generating the word line selection signals S0 to Sm and bank selection signals SSE and SSO are well known to those skilled in the art, their detailed description is omitted.

The depletion-type NMOS transistors 416 and 424 are designed to have a very small driving capability. The NMOS transistors 416 and 424 discharge the nodes 415 and 425 in all the driving circuits 410 and 451 to 451a to ground potential during a standby state. Additionally, NMOS transistors 416 and 424 discharge the nodes 415 and 425 in unselected driving circuits to ground potential during a read/write operation.

Figure 6:
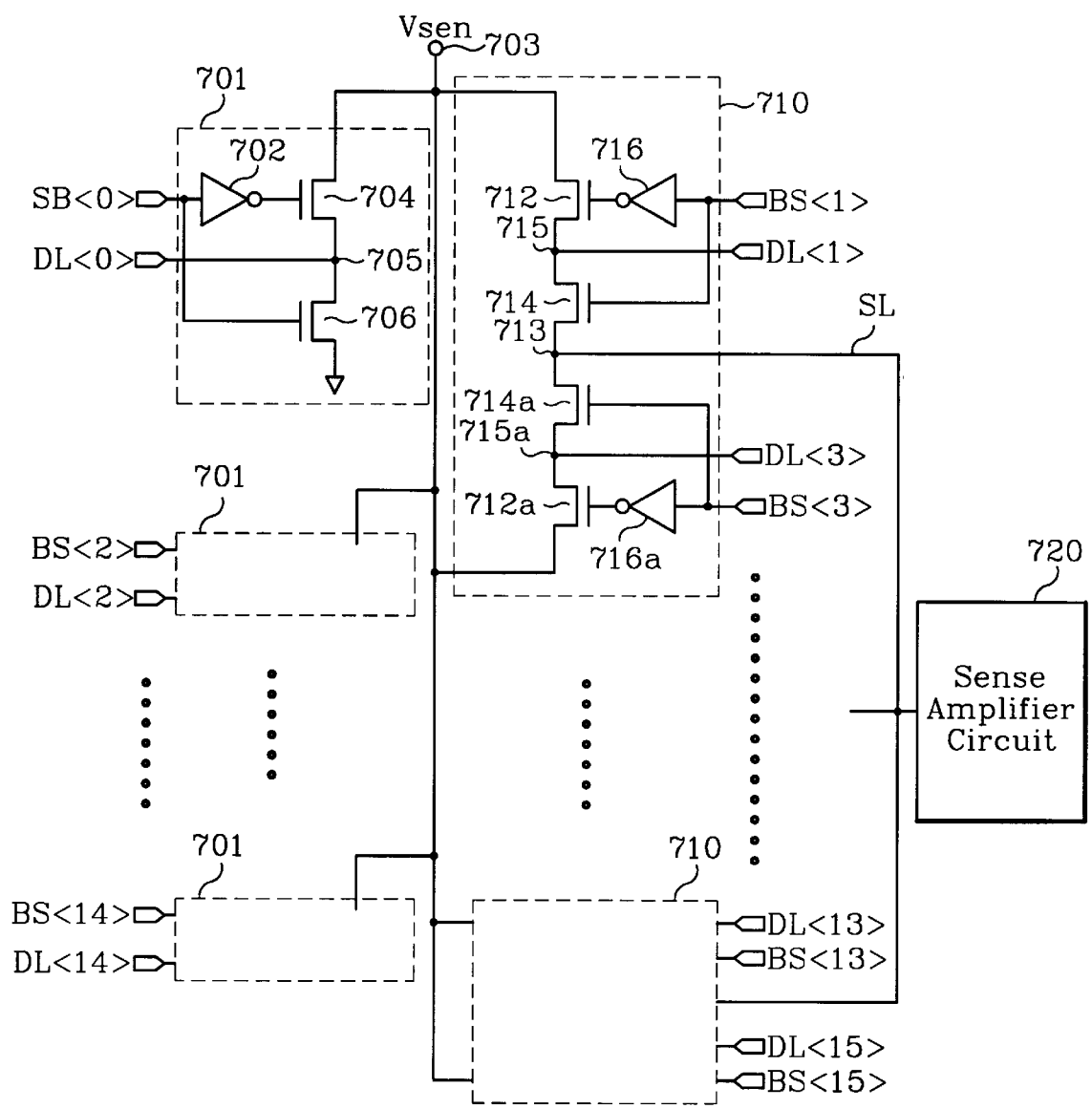
FIG. 6 is a detailed circuit diagram of the sense/precharge circuit for the memory device shown in FIG. 3.

FIG. 6 shows a sense/precharge circuit of the memory device shown in FIG. 3. For exemplary purposes only, the circuit of FIG. 6 shows the number of bit line selection signals BS0 to Bsi, the number of the main bit lines MBL0 to MBLi and the data lines DL0 to DLi, as equal to 16.

Referring to FIG. 6, the sense/precharge circuit 700 comprises a plurality of first driving circuits 701 for controlling even-numbered data lines DL0, DL2, . . . , $DL_{2i}$, a plurality of second driving circuits 710 for controlling odd-numbered data lines DL1, DL3, . . . , $DL_{2i+1}$, and a sense amplifier circuit 720 connected in common to the second driving circuits 710 via sense line SL.

The first driving circuit 701 connected to the first data line DL0 receives the bit line selection signals BS0 and is composed of an inverter 720 and two enhancement type NMOS transistors 704 and 706. Current paths of the NMOS transistors 704 and 706 are connected in series between ground and a terminal 703. Terminal 703 receives the sense voltage Vsen. Gates of the NMOS transistors 704 and 706 are controlled by an inverted version of the bit line selection signal BS0 and a non-inverted version of the bit line selection signal BS0, respectively. A connection node 705, located between the current paths of the NMOS transistors 704 and 706, is coupled to the first data line DL0. The other driving circuits 701, to which respective bit line selection signals BS2, BS4, . . . , BS14 are applied, have the same circuit construction as that of the first driving circuit 701, to which the bit line selection signal BS0 is applied.

A second driving circuit 710 is connected to second and fourth data lines DL1 and DL3. The second driving circuit 710 receives the second and fourth bit line selection signals BS1 and BS3 and comprises four enhancement type NMOS transistors 712, 712a, 714, and 714a and two inverters 716 and 716a. The NMOS transistors 712 and 714 have current paths formed in series between the terminal 703 for receiving the sensing voltage Vsen and a connection node 713 connected to the circuit 720, respectively. The gates of the transistors 712 and 714 receive an inverted version of the second bit line selection signal BS1 16 and the second bit line selection signal BS1, respectively. The connection node 715, located between current paths of the transistors 712 and 714, is coupled to the second data line DL1.

The NMOS transistors 712a and 714a have current paths connected in series between the terminal 703 and the connection node 713. The transistor 712a has a gate for receiving an inverted version of the fourth bit line selection signal BS3. The transistor 714a has a gate for receiving the fourth bit line selection signal BS3. A connection node 715a is located between the current paths of the NMOS transistors 712a and 714a and coupled to the second data line DL3.

In accordance with the above-mentioned construction, the even-numbered data lines DL0, DL2, . . . , DL14 are supplied with the sensing voltage Vsen (i.e., connected to the terminal 703) or with ground potential according to respective voltage levels on the corresponding bit line selection signals BS0, BS2, . . . , BS14. The odd-numbered data lines DL1, DL3, . . . , DL15 are supplied with the sensing voltage Vsen (i.e., connected to the terminal 703) or are connected through sensing line SL to the sense amplifier circuit 720 according to the corresponding bit line selection signals BS1, BS3, . . . , BS13, BS15. For example, if a data line DL1 is selected, an adjacent data line DL0 corresponding to the selected data line DL1 is grounded and the others are supplied with the sensing voltage Vsen.

Figure 7:
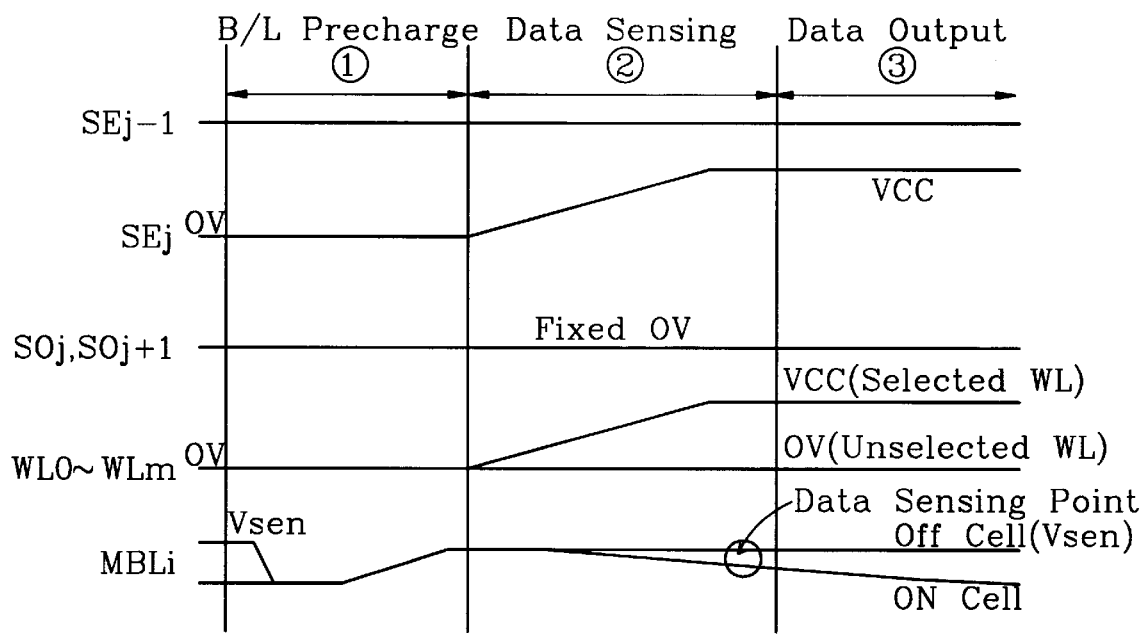
FIG. 7 is a timing diagram of a data reading operation for the memory device shown in FIG. 3.

FIG. 7 is a timing diagram of a data reading operation for the memory device shown in FIG. 3. The data reading operation of the present invention will be described below with reference to FIGS. 3 to 7.

The data reading operation is separated into three periods: a bit line precharge period 1, a data sensing period 2, and a data output period 3. The data reading operation of the present invention will be described using as an example the reading of the data stored in memory cell M00 of memory cells Mmn in a selected array block 110.

First, during the bit line precharge period 1, main bit lines MBL0 to MBLi are supplied with the sensing voltage Vsen, word lines WL0 to WLi are supplied with ground potential, and bank selection signals SEj and SOj are at ground potential. By doing so, the main bit lines MBL0 to MBLi are precharged to the sensing voltage Vsen. After all the main bit lines MBL0 to MBLi are precharged, the precharge operation is paused.

During the data sensing period 2, a word line WL0 in the array block 110 selected by the block/word line selecting circuit 400 is driven to the sensing voltage Vsen from ground potential. An even-numbered bank selection signal SEj changes to the power supply voltage from ground potential by the even-numbered driving circuit 451 within the block/word line selecting circuit 400. At this time, a (j−1)th even-numbered bank selection signal SEj−1 and a j-th and (j+1)th odd-numbered bank selection signals SOj and SOj+1 are maintained at ground potential. A (j−1)th even-numbered bank selection signal SEj−1 is applied to the (j−1)th block adjacent to j-th array block. A j-th and (j+1)th odd-numbered bank selection signals SOj and SOj+1 is applied to the (j−1)th block adjacent to the j-th array block.

At the same time that the sensing voltage Vsen is applied onto the main bit line MBL1, a load current from the sense amplifier 720 is supplied to the main bit line MBL1 selected by bit line selection signals BS0 to BSi from the column selecting circuit 500 while a main bit line MBL0 adjacent to and associated with the selected main bit line MBL1 is grounded. The sensing voltage Vsen is applied to all the other main bit lines MBL2 to MBLi. At a data sensing point of (shown in FIG. 7), the sense amplifier 720 senses the data of selected memory cell M00. If the selected memory cell M00 is an on-cell, the load current provided to the selected main bit line MBL1 from the sense amplifier circuit 720 flows through a discharge path formed between the main bit line MBL1 and its adjacent main bit line MBL0 such that the voltage level on the selected main bit line MBL1 becomes lower. Herein, the discharge path is composed of current paths of transistors 10, M00, and 12.

On the other hand, if the selected memory cell M00 is an off-cell, the voltage level on the selected main bit line MBL1 continues to be the sensing voltage Vsen. Therefore, the sense amplifier circuit 720 senses the data of the selected memory cell M00 through a data line DL1 coupled to both the selected main bit line MBL1 and a relevant sense line SL, and then the sensed data is provided to the external circuitry during the data output period 3.

When the off-cell data is read according to the above-mentioned reading method, sensing margin drop off due to the leakage current is prevented. Namely, even though memory cells M01, M02, M03, and M04, adjacent to the selected memory cell M00 and connected in common to a selected word line WL0, are on-cells, the current paths of the cells M01, M02, M03, and M04 are not formed because the sensing voltage Vsen is applied on the word line WL0 and sub-bit lines SBL2 to SBL5 corresponding to the cells M01, M02, M03, and M04 are precharged with the sensing voltage Vsen.

The voltage difference between the respective gates and sources of the cells M01, M02, M03, and M04 is 0 V such that they are all turned off during the data sensing period 2. By sensing the off-cell data according to the present invention, the off-cell sensing margin is ensured and a high speed data sensing operation for a NOR type mask ROM device is embodied.

2. Second Embodiment

Figure 2:
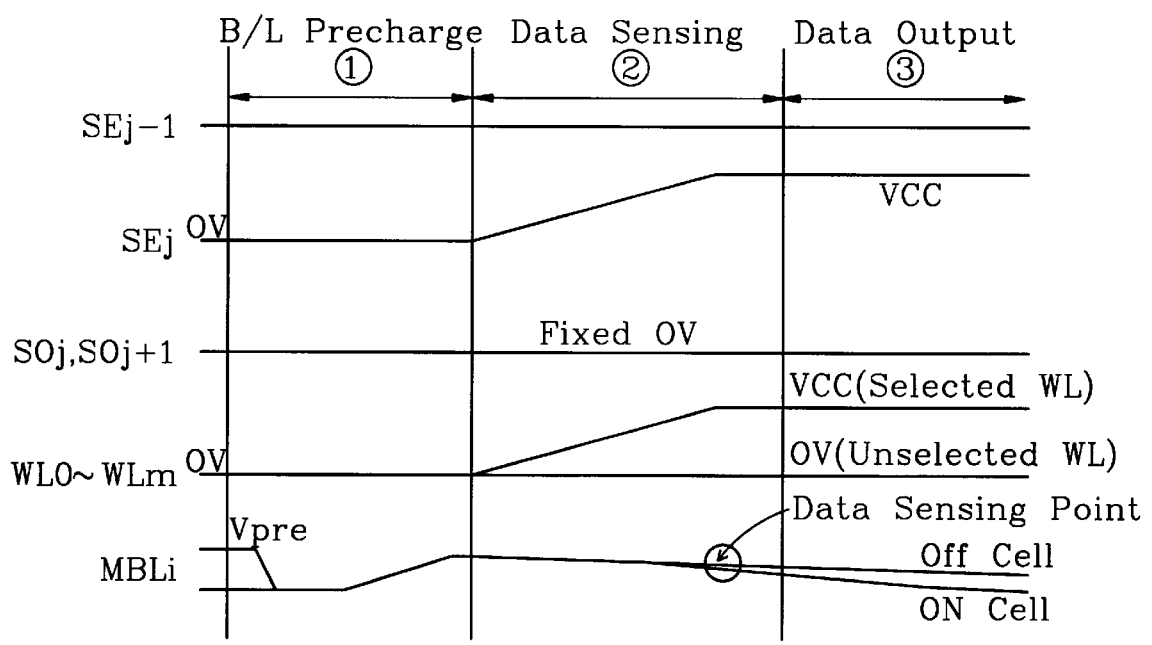
FIG. 2 is a timing diagram of a reading operation for the memory device shown in FIG. 1.

The first embodiment according to the present invention is a NOR type mask ROM device having a memory cell array having NOR type memory cells for storing a single bit data. The second embodiment of the present invention is a device and a method for reading multi-bit data to prevent leakage current from being produced at the off-cell. The reading operation of memory cell having four possible threshold voltages Vth1, Vth2, Vth3, and Vth4 is performed by repeating three times the bit line precharge period 1 and the data sensing period 2 shown in FIG. 2 for reading single bit data. The multi-bit data stored in a selected memory cell is read by varying a voltage applied on a selected word line from a minimum level to a maximum level or from a maximum to a minimum level with a predetermined interval.

In the second embodiment, the voltage level applied to word line and main bit lines is at the same level as the sensing voltage Vsen as with the first embodiment. During operation periods, a voltage with a predetermined interval varies from a minimum level to a maximum level. This varying voltage is applied to an adjacent main bit line (referred to as source line) associated with a selected main bit line so that the device for reading multi-bit data can be embodied. On the other hand, though the varying voltage is applied to the main bit line (the source line), it should be obvious to those skilled in the art that the same result as the former is obtained. A block diagram of the preferred second embodiment is shown in FIG. 8.

Figure 8:
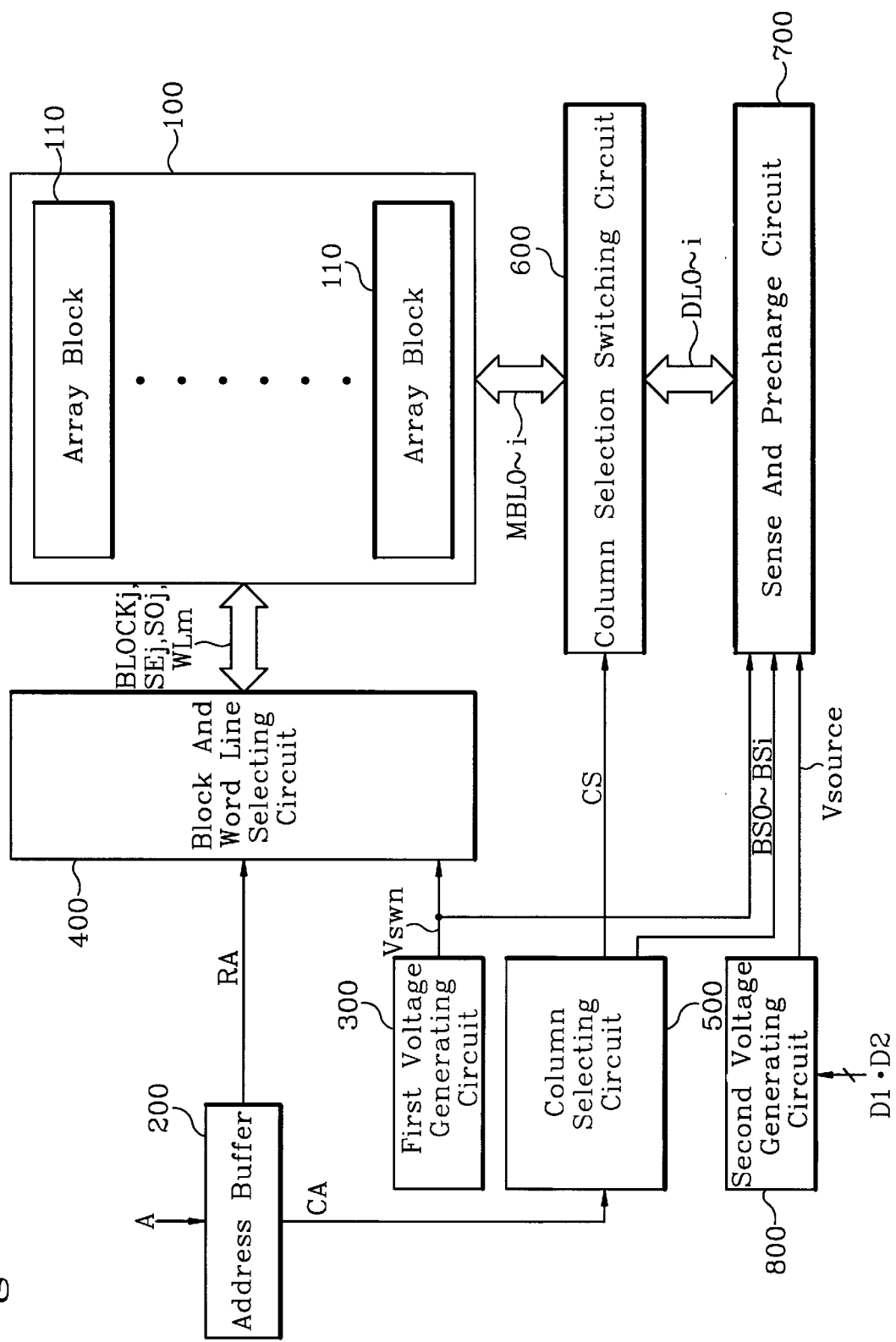
FIG. 8 is a block diagram of a NOR type semiconductor memory device according to a second embodiment of the present invention.

Referring to FIG. 8, a memory cell array 100 is divided in a row direction into a plurality of array blocks 110, each of the array blocks 110 having a plurality of NOR type memory cells (not shown) for storing multi-bit data. The function of an address buffer circuit 200, a first voltage generating circuit 300, a block/word line selecting circuit 400, a column selecting circuit 500, and a column selection switching circuit 600 is the same as equivalent circuits shown in FIG. 3. Accordingly, the description of the operation of these circuits is not repeated.

Referring to FIG. 8, a second voltage generating circuit 800 generates a source voltage Vsource responsive to control signals D1 and D2. The source voltage Vsource is applied to a source line associated with an addressed memory cell. The source voltage Vsource varies with a predetermined interval from ground potential (refer to the operation timing diagram shown in FIG. 12). In the preferred embodiment, the precharge and data sensing periods 1 and 2 are repeated three times during the multi-bit data reading operation.

A sense/precharge circuit 700 precharges all main bit lines MBL0 to MBLi at the sensing voltage Vsen during the bit line precharge operation and supplies the sensing voltage Vsen to a selected main bit line and the unselected main bit lines during the data sensing operation. Furthermore, the circuit 700 senses the threshold voltage of the selected memory cell at the data sensing point (shown in FIG. 7) by supplying the sensing voltage Vsen to an adjacent main bit line (or, source line) associated with the selected main bit line.

Figure 9:
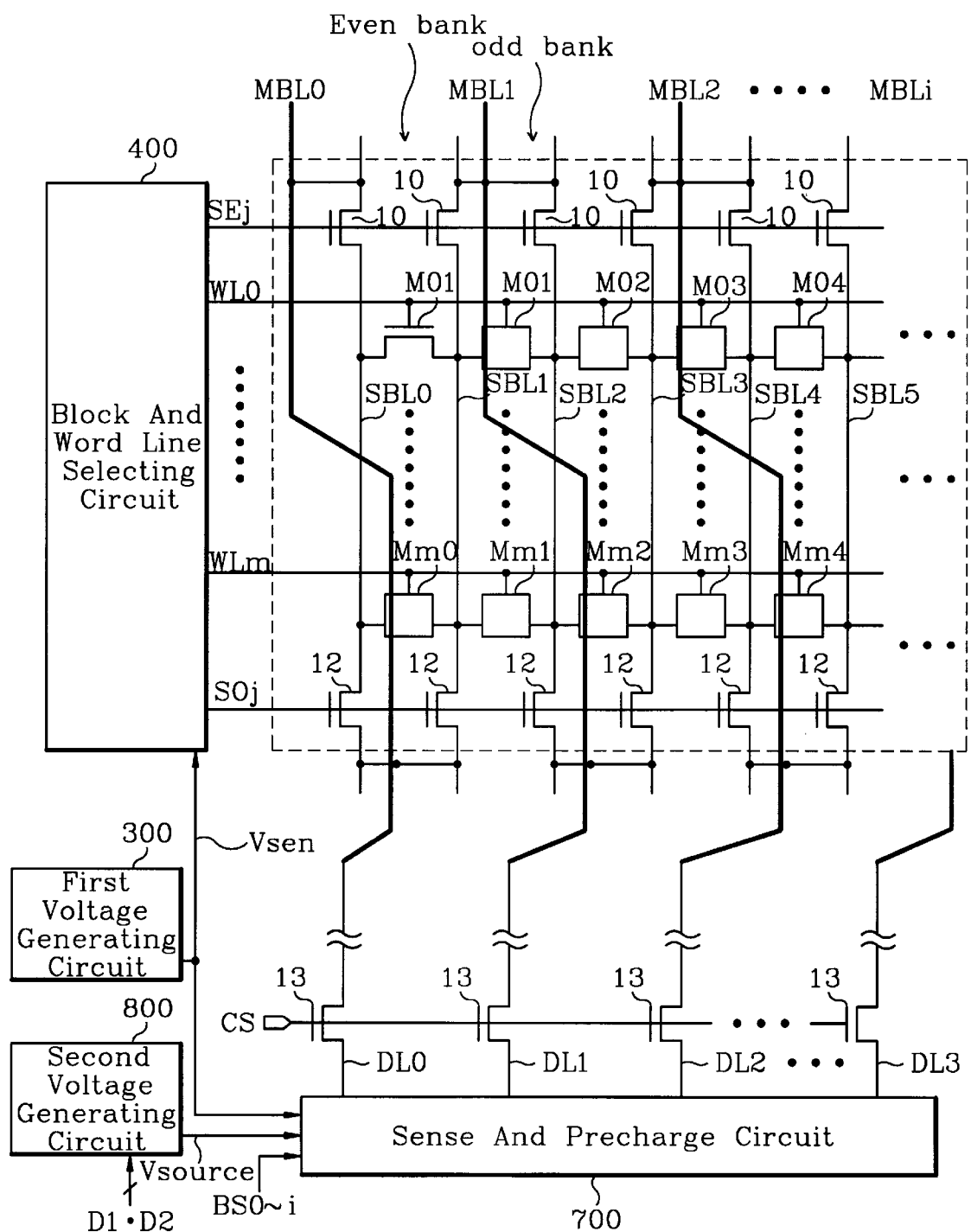
FIG. 9 is a detailed circuit diagram of the memory cell array and the peripheral blocks for the memory device shown in FIG. 8.

FIG. 9 shows the equivalent circuit of an array block 110 of the memory device and peripheral blocks thereof. In this figure, the first voltage generating circuit 300 generates the sensing voltage Vsen by dividing a power supply voltage VCC and a second voltage generating circuit 800 generates a source voltage Vsource to be applied to a source line associated with an addressed memory cell in responsive to the control signals D1 and D2. The sense/precharge circuit 700 receives the sensing voltage Vsen and the source voltage Vsource and then performs the sensing operation for the addressed memory cell in response to a plurality of bit line selection signals BS0 to BSi received from a column selection circuit 500 (FIG. 3).

Figure 10:
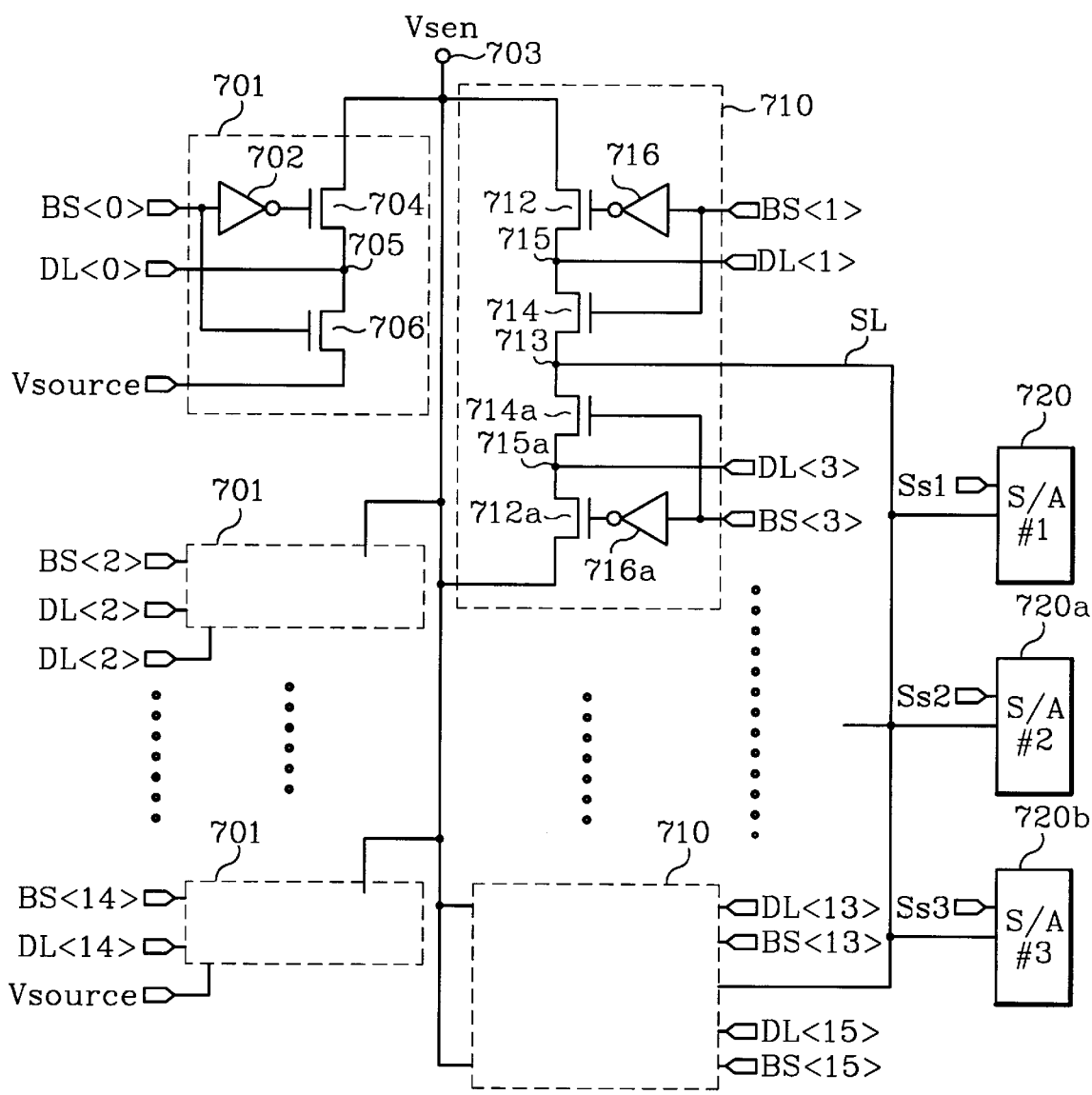
FIG. 10 is a detailed circuit diagram of the sense/precharge circuit for the memory device shown in FIG. 8.

FIG. 10 shows a sense/precharge circuit 700 of the memory device shown in FIG. 8. In this figure, the sense/precharge circuit 700 comprises a first driving circuits 701 for controlling a plurality of even-numbered data lines DL0, DL2, . . . , DL14, second driving circuits 710 for controlling a plurality of odd-numbered data lines DL1, DL3, . . . , DL15, and three sense amplifier circuits 720, 720a, and 720b connected in common to the second driving circuits via a sense line SL. Constituents of the first and second driving circuits 701 and 710 are equal to those of the first embodiment. However, one difference between the first and second driving circuits 701 and 710 of the first and second embodiments is that while ground potential is applied to the first driving circuits 701 in the first embodiment, the source voltage Vsource from the second voltage generating circuit 800 is applied to the first driving circuits 701 in the second embodiment. Moreover, the three sense amplifier circuits 720, 720a, and 720b is controlled by corresponding selection signals Ss1, Ss2, and Ss3, and are connected in common to the second driving circuits 710 through the sensing line SL.

Therefore, the sensing voltage Vsen or the source voltage Vsource is applied to each of even-numbered data lines DL0, DL2, . . . , DL14 in response to corresponding bit line selection signals BS0, BS2, . . . , BS14. Each of odd-numbered data lines DL1, DL3, . . . , DL15 is supplied with the sensing voltage Vsen or is connected through sensing line SL to the sense amplifier circuits 720, 720a, 720b in response to corresponding bit line selection signals BS1, BS3, . . . , BS15. Accordingly, as shown in FIG. 10, if a data line is selected, an even-numbered data line adjacent to and associated with the selected data line is supplied with the source voltage Vsource, while the others are supplied with the sensing voltage Vsen.

Figure 11:
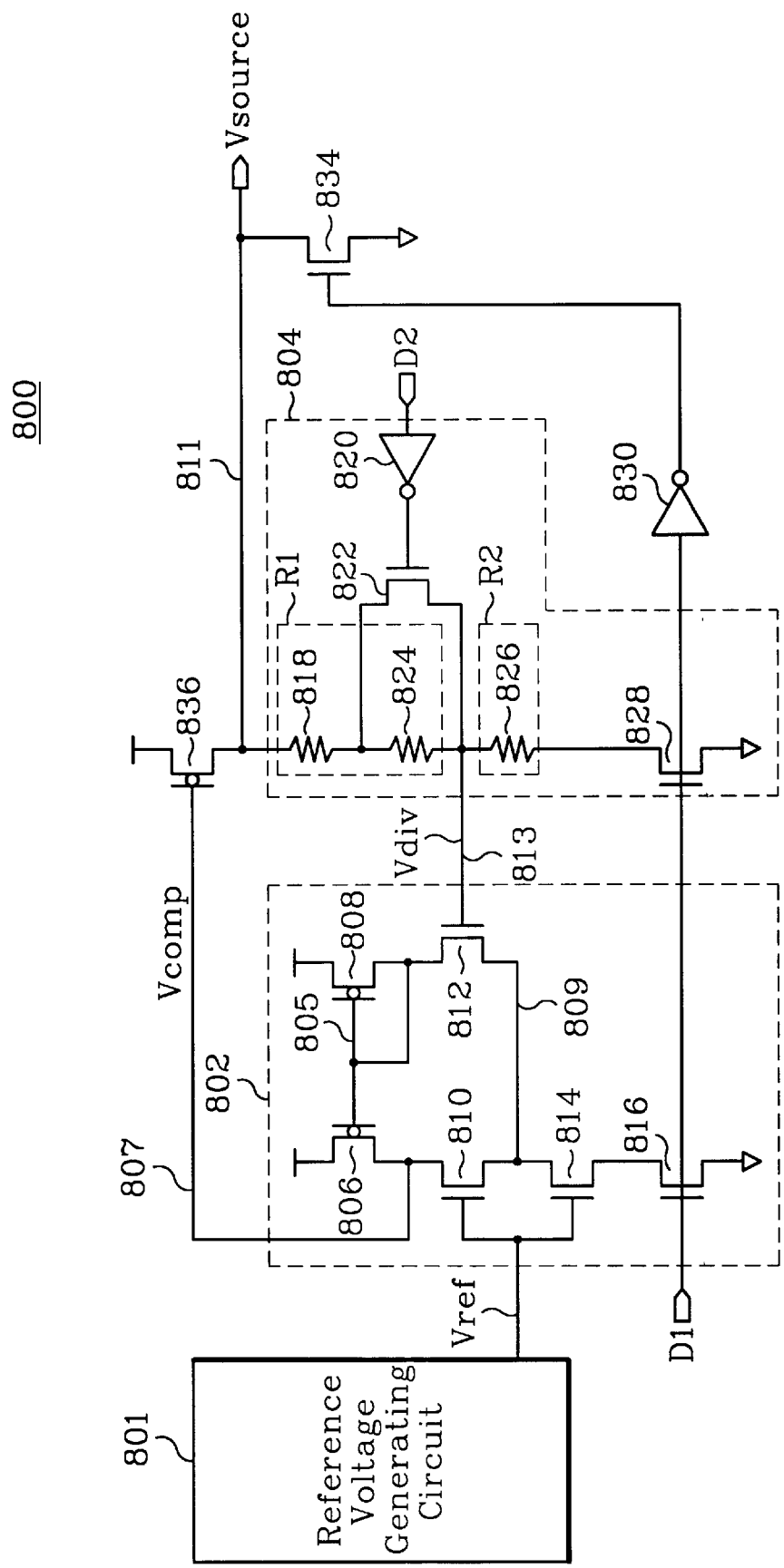
FIG. 11 is a detailed circuit diagram of the source voltage generating circuit for the memory device shown in FIG. 8.

FIG. 11 shows the second voltage generating circuit of the memory device shown in FIG. 8. In this figure, a second voltage generating circuit 800 generates a source voltage Vsource which varies with a predetermined interval from a ground potential in response to a signal Vref from a reference voltage generating circuit 801 and control signals D1 and D2. The circuit 800 is comprised of a reference voltage generating circuit 801, a PMOS transistor 836, a differential amplifier circuit 802 serving as a comparator, an inverter 830, a NMOS transistor 834, and a circuit 830 for supplying a variable and divided voltage Vdiv by dividing the source voltage Vsource according to a variable resistance value thereof.

The differential amplifier circuit 802 is supplied with the signal Vref from the reference voltage generating circuit 801 and a signal Vdiv from the circuit 804. Then compares voltage levels of the two signals Vref and Vdiv responsive to the control signal D1, generating a signal Vcomp as a comparison result. The circuit 802 has two PMOS transistors 806 and 808 and four NMOS transistors 810, 812, 814, and 816. The PMOS transistor 806 has a drain connected to a line 807 for transmitting the signal Vcomp, a source for receiving a power supply voltage, and a gate coupled to a node 805. The PMOS transistor 808 has a drain coupled to the node 805, a source for receiving the power supply voltage, and a gate coupled to the node 805. Current paths of the NMOS transistors 810, 814, and 816 are formed in turn and in series between the line 807 and ground potential. The gates of the transistors 810 and 814 are controlled in common by the signal Vref, and the gate of the transistor 816 is controlled by the control signal D1. The transistor 812 has a current path formed between the node 805 and a node 809 and a gate connected to output terminal 813 of the clamp circuit 804.

The PMOS transistor 836 is a driver. While the PMOS transistor 836 is disabled when the signal Vcomp is at a logic high level, it drives a predetermined amount of current to a node 811 (for outputting the source voltage Vsource) when the signal Vcomp is at a logic low level. The transistor 836 has a current path thereof formed between the terminal 703 and the node 811 and a gate to which the signal Vcomp is applied.

The circuit 804 comprises three resistors 818, 824, and 826, an inverter 820, and two NMOS transistors 822 and 828. The resistors 818 and 824 are coupled in series between the nodes 811 and the node 813. The transistor 822 has a current path formed in both terminals of the resistor 824 and a gate connected to an output terminal of the inverter 820 for inverting a phase of the control signal D2. One of two terminals of the resistor 826 is connected to the node 813. The transistor 828 has a current path formed between the other terminal of the resistor 826 and ground potential and has a gate controlled by the control signal D1. The PMOS transistor 834 has a current path formed between the node 811 and ground potential and a gate coupled to output terminal of the inverter 830 for inverting the phase of control signal D1.

The second voltage generating circuit 800 of the above-mentioned configuration generates the source voltage Vsource varying in turn every precharge and data sensing periods 1 and 2 (refer to FIG. 12) responsive to the control signals D1 and D2. Variation of the source voltage Vsource according to combination with the control signals D1 and D2 is illustrated in FIG. 12, which will be in detail described below.

Figure 12:
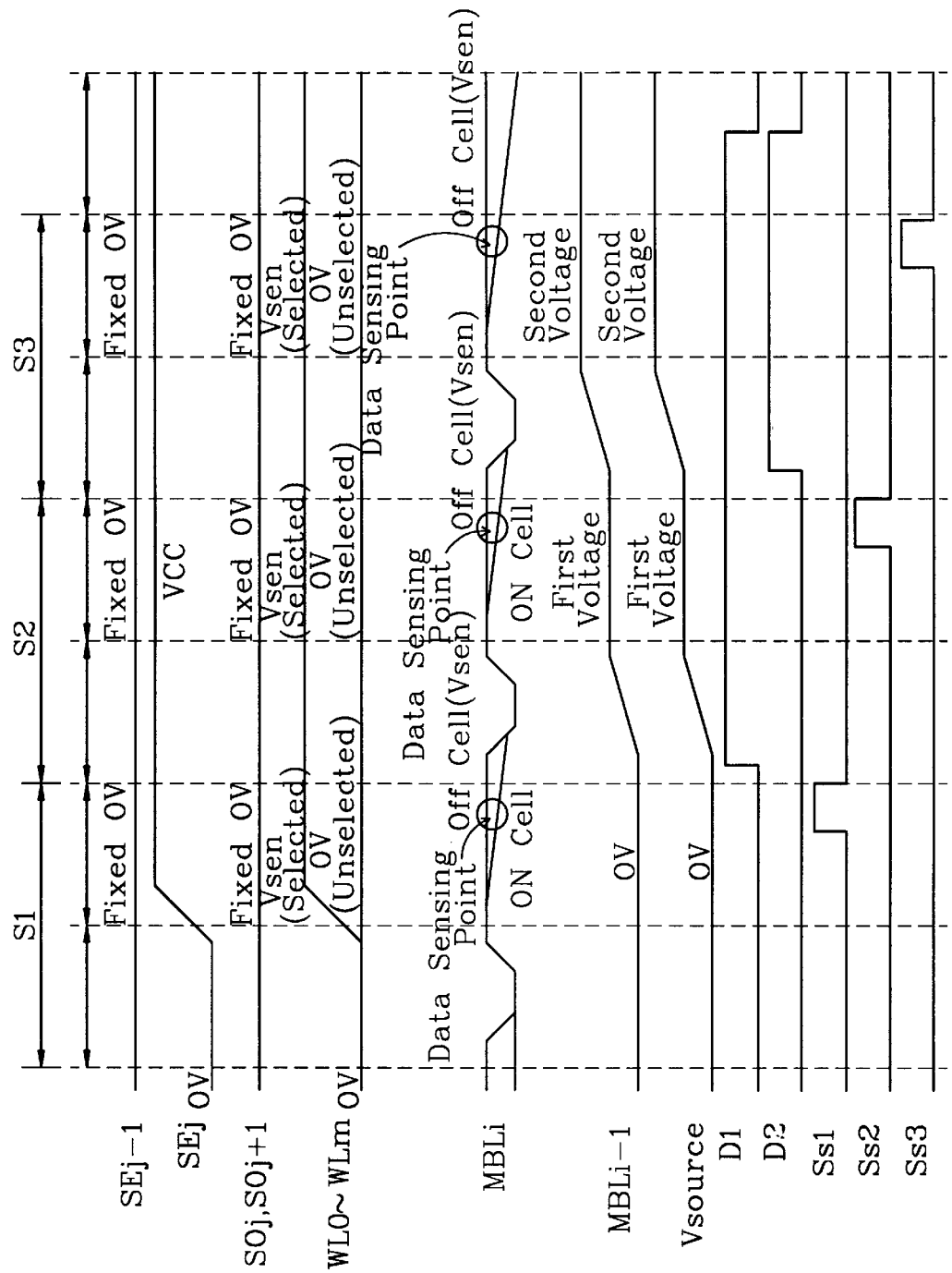
FIG. 12 is a timing diagram of a multi-bit data reading operation for the memory device shown in FIG. 8.

FIG. 12 is a timing diagram for the reading operation associated with a NOR type memory cell of mask ROM, that can store multi-bit data according to the second embodiment of the present invention. The reading operation will be described below with reference to FIGS. 8 to FIG. 12. The timing diagram of FIG. 12 is an example of the sensing operations of the multi-bit data by performing the repeated cycles S1, S2, and S3 consisting of the precharge and data sensing periods 1 and 2. Assume that each of memory cells capable of storing the multi-bit data receives one of first through fourth threshold voltages Vth1, Vth2, Vth3 and Vth4, wherein Vth1<Vth2<Vth3<Vsen<Vth4.

Referring to FIG. 12, the first cycle S1, the second cycle S2 and the third cycle S3 is performed in turn during the data reading operation, each of the cycles S1, S2, and S3 is composed of the precharge period 1 and the data sensing period 2. If the respective cycles S1, S2, and S3 should be completed, the data that is sensed by the sense amplifier circuits 720, 720a, and 720b shown in FIG. 10 is provided to external circuitry during a data output period 3. As an example, the data reading operation on the data held by a memory cell M00 of memory cells M00 to Mmn within an array block 110 is described.

First, during the first cycle S1, the control signals D1 and D2 and source voltage Vsource are maintained at ground potential. At the precharge period 1 of the first cycle S1, the sensing voltage is supplied to main bit lines MBL0 to MBLi and word lines WL0 to WLm and bank selection signals SEj and SOj are maintained at ground potential so that all the main bit lines MBL0 to MBLi are precharged to the sensing voltage Vsen.

During the data sensing period 2, after the precharge operation of the main bit lines MBL0 to MBLi is ended, a selected word line WL0 within an array block 110 selected by the block/word line selecting circuit 400 is driven with the sensing voltage Vsen. Furthermore, the even-numbered bank selection signal SEj goes to the power supply voltage by a relevant even-numbered driving circuit of bank selecting circuits 451 and 451a within the block/word line selecting circuit 400. Simultaneously, the sensing voltage Vsen is applied to the main bit line MBL1, load current from the sense amplifier 720 is provided to the main bit line MBL1 selected by bit line selection signals BS0 to BSi while a source voltage Vsource (e.g., 0 V) is supplied on a source line MBL0 adjacent to and associated with the selected main bit line MNL1. The sensing voltage Vsen is supplied. At this time, the data stored in the selected memory cell M00 is sensed by the sense amplifier circuit 720 in data sensing point of FIG. 12.

If the threshold voltage of the selected memory cell M00 is lower than the fourth threshold voltage Vth4, load current flows to the adjacent source line MBL0 from the selected main bit line MBL1 through bank selection transistors 10 and 12 and the selected memory cell M00, so that voltage level on the selected main bit line MBL1 becomes lower than the precharge sensing voltage Vsen as shown in FIG. 12. On the other hand, if the threshold voltage of the selected memory cell M00 is higher than the fourth threshold voltage Vth4, the selected main bit line MBL1 is maintained at the precharged sensing voltage Vsen. As shown in FIG. 12, when a first sensing signal Ss1 of high level is applied to a first sense amplifier circuit 720 shown in FIG. 10, the circuit 720 is enabled, and then senses the voltage on the selected main bit line MBL1.

During the second cycle S2, the control signal D1 goes to a logic high level and the source voltage Vsource goes to a first voltage V1 having predetermined voltage level generated a second voltage generating circuit 800. Herein, the voltage level of the first voltage V1 is between a Vsen-Vth3 voltage and a Vsen-Vth2 voltage, Vsen is the sensing voltage, Vth2 is the second threshold voltage, and Vth3 is the third threshold voltage. Similarly with the same method as the first cycle S1, all the main bit lines MBL0 to MBLi are precharged at the sensing voltage Vsen during the precharge period 1 of the cycle S2.

Then, during the data sensing period 2, the selected word line WL0 and the even-numbered bank selection signal SEj are biased to the same voltage level as in the first cycle S1. Simultaneously, under such a condition that the sensing voltage Vsen is applied to the selected main bit line MBL1, a load current from the sense amplifier circuit 720 is supplied on the selected main bit line MBL1 while the adjacent source line MBL0 is supplied with the first voltage (i.e., the source voltage Vsource). The others are supplied with the sensing voltage Vsen. At the data sensing point of the data sensing period 2, as shown in FIG. 12, when a first sensing signal Ss1 of high level is applied to a second sense amplifier circuit 720a shown in FIG. 10, the circuit 720a is enabled, and then senses the voltage on the selected main bit line MBL1.

If the threshold voltage of the selected memory cell M00 is more than the third threshold voltage Vth3, the selected memory cell M00 is an off-cell. If the threshold voltage of the selected memory cell M00 is lower than the third threshold voltage Vth3, the selected memory cell M00 is an on-cell. As shown in FIG. 12, a second sense amplifier circuit 720a is enabled when a second sensing signal Ss2 having a logic high level is applied to it, so that voltage level of the selected main bit line MBL1 is sensed thereby.

Finally, during the third cycle S3, control signals D1 and D2 go to a logic high level, so that the source voltage Vsource becomes a second voltage V2 by the second voltage generating circuit 800. Herein, the second voltage V2 is between a (Vsen-Vth3) voltage and a (Vsen-Vth4) Vsen is the sensing voltage Vsen, Vth3 is the third threshold voltage, and Vth4 is the fourth threshold voltage. During the precharge period 1 of the cycle S3, all the main bit lines MBL0 to MBLi are precharged to the sensing voltage Vsen in the same way as in the first and second cycles S1 and S2.

Then, during a data sensing period 2, the selected word line WL0 and the even-numbered bank selection signal SEj are biased with the same level of the second cycle S2. Simultaneously, in the condition that the sensing voltage Vsen is applied to the selected main bit line MBL1, a load current from sense amplifier circuit 720b is supplied to the selected main bit line MBL1. And the second voltage V2 (i.e., the source voltage Vsource) is supplied to an adjacent source line MBL0 associated with the selected main bit line MBL1. The others are provided with the sensing voltage Vsen.

At the data sensing point, the data stored in the selected memory cell M00 is sensed. If the threshold voltage of the selected memory cell M00 is more than a second threshold voltage Vth2, the selected memory cell M00 is an off-cell, and if lower, the selected memory cell M00 is an on-cell. As shown in FIG. 12, a third sense amplifier circuit 720b is enabled when a third sensing signal Ss3 of high level is applied thereto such that the circuit 720b senses voltage level on the selected main bit line MBL1. Then, at a data output period 3, the sensed data by the sense amplifier circuits 720, 720a, and 720b is provided as a multi-bit data through a logic circuit (not shown).

With the device and method according to the first and second embodiment of the invention, the sensing voltage Vsen is applied into a word line (e.g., WL0) associated with a memory cell for reading and to the i-th main bit line MBLi. A source voltage Vsource is applied to adjacent source line MBLi−1 (i.e., (i−1)th main bit line MRLi−1 adjacent to a selected I-th main bit line MBLi). And, the sensing voltage Vsen is applied to the other main bit lines. Even though memory cells adjacent to the selected memory cell (i.e., off-cell) and coupled to the same word line WL0 are on-cell, their current paths is not formed because voltage level on sub-bit lines associated with the adjacent memory cells continues to be the same level as the word line WL0 during a data reading operation.

As a result, in the case of sensing the multi-bit data according to the above-mentioned data reading method, the reduction in the data sensing margin due to unwanted leakage current through adjacent cells at the off-cell sensing operation is prevented. Also, the above-mentioned multi-bit data reading method for controlling a source line can be performed faster and safer than the method for controlling a word line.

On the other hand, the voltage of the same level as a selected word line or of higher level than that is applied to main bit lines excepting a word line and a source line (adjacent to a selected main bit line) associated with the selected memory cell such that the sensing margin at an off-cell sensing operation can be not only assured, but also the off-cell data sensing speed can is improved.

Having illustrated and described the principles of my invention in a preferred embodiment thereof, it should be readily apparent to those skilled in the art that the invention can be modified in arrangement and detail without departing from such principles. I claim all modifications coming within the spirit and scope of the accompanying claims.

What is claimed is:

1. A NOR type semiconductor memory device, comprising:
    a plurality of word lines extending in a first direction;
    a plurality of first bit lines extending in a second direction;
    a plurality of second bit lines extending in the second direction;
    a plurality of data lines corresponding to the plurality of first bit lines;
    a cell array divided into a plurality of blocks, each block having a plurality of memory cells corresponding to the plurality of word lines, each memory cell connected in parallel between pairs of second bit lines;
    means for selecting even-numbered blocks in response to a first selection signal;
    means for selecting odd-numbered blocks in response to a second selection signal;
    means for generating a first voltage by dividing an externally applied power supply voltage;
    an address buffer for converting an external address signal having a TTL logic level into a row and a column address signals each having a CMOS logic level;
    means for selecting one of the plurality of word lines in response to the row address signal, supplying the first voltage to the selected word line, and generating the first and second selection signals;
    means for selecting columns of the cell array and generating a column selection signal and a plurality of bit line selection signals in response to the column address signal;
    switching means for electrically coupling a first bit line selected by one of the plurality of bit line selection signals with a corresponding data line in response to the column selection signal; and
    means for sensing data stored in a memory cell associated with the selected first bit line and the selected word line;
    wherein the means for sensing data supplies the first voltage to the plurality of first bit lines in response to the bit line selection signals during a bit line precharge period, supplies the first voltage to the plurality of first bit lines during a data sensing period, and supplies a second voltage to at least one of the plurality of first bit lines adjacent to the selected first bit line, the first voltage being equal to or lower than the second voltage.

2. The NOR type semiconductor memory device according to claim 1 wherein each of the memory cells comprises an NMOS transistor having a gate connected to a corresponding word line and a current path formed between cross-coupled portions of the word lines and the second bit lines.

3. The NOR type semiconductor memory device according to claim 1 wherein the first and second selection signals each have a voltage level equal to a voltage level of the power supply voltage.

4. The NOR type semiconductor memory device according to claim 1 wherein the means for selecting even-numbered blocks comprises a first plurality of NMOS transistors, each NMOS transistor of the first plurality of NMOS transistors having a gate for receiving the first selection signal and a current path formed between an upper end of a corresponding second bit line and a corresponding first bit line.

5. The NOR type semiconductor memory device according to claim 4 wherein the means for selecting odd-numbered blocks comprises a second plurality of NMOS transistors, each NMOS transistor of the second plurality of NMOS transistors having a gate for receiving the second selection signal and a current path formed between a lower end of a corresponding second bit line and a corresponding first bit line.

6. The NOR type semiconductor memory device according to claim 5 wherein the second voltage has a voltage level equal to a voltage level of the power supply voltage minus a threshold voltage level of any of the NMOS transistors of the first or second plurality of NMOS transistors.

7. A NOR type semiconductor memory device, comprising:
    a plurality of word lines extending in a row direction;
    a plurality of first bit lines extending in a column direction;
    a plurality of second bit lines extending in the column direction;
    a plurality of data lines corresponding to the plurality of first bit lines;
    a cell array having a plurality of banks, each bank including a plurality of memory cells corresponding to the plurality of word lines and coupled to the plurality of second bit lines;
    means for selecting even-numbered banks in response to a first selection signal, the means for selecting even-numbered banks including a first plurality of NMOS transistors, each NMOS transistor of the first plurality of NMOS transistors having a gate for receiving the first selection signal and a current path coupled between a corresponding first bit line and an upper end of a corresponding second bit line;
    means for selecting odd-numbered banks in response to a second selection signal, the means for selecting odd-numbered banks including a second plurality of NMOS transistors, each NMOS transistor of the second plurality of NMOS transistors having a gate for receiving the second selection signal and a current path coupled between a corresponding first bit line and a lower end of a corresponding second bit line;

means for generating a first voltage by dividing an externally applied power supply voltage, the first voltage being equal to or lower than a second voltage, the second voltage being equal to the power supply voltage minus a threshold voltage of any of the first or second plurality of NMOS transistors;

means for selecting one of the plurality of word lines in response to an externally applied row address signal, supplying the first voltage to the selected word line, and alternately generating the first and second selection signals to select the even-numbered or odd-numbered banks during a reading operation;

means for selecting a first bit line in response to a column address signal; and means for supplying the first voltage to the plurality of first bit lines, supplying a third voltage to at least one of the second bit lines adjacent to the selected first bit line, and sensing data from a memory cell associated with the selected word line and the selected first bit line.

8. The NOR type semiconductor memory device according to claim 7 wherein the first and second selection signals each have a voltage level equal to the power supply voltage.

9. The NOR type semiconductor memory device according to claim 7 wherein the third voltage is equal to ground potential.

10. A NOR type semiconductor memory device, comprising:

a plurality of word lines extending in a first direction;

a plurality of first bit lines extending in a second direction;

a plurality of second bit lines extending in the second direction;

a cell array divided into a plurality of banks, each bank having a plurality of memory cells corresponding to the plurality of word lines, each memory cell being connected in parallel between pairs of second bit lines and operating in a first, second, third, or fourth state corresponding to a first, second, third, or fourth threshold voltage, respectively;

a plurality of first NMOS transistors for selecting even-numbered banks in response to a first selection signal;

a plurality of second NMOS transistors for selecting odd-numbered banks in response to a second selection signal;

means for generating a first voltage by dividing an externally applied power supply voltage;

means for generating a second voltage having at least three voltage levels in response to control signals, the three voltage levels varying within a predetermined voltage range;

means for selecting one of the plurality of word lines in response to a row address signal during a reading operation and supplying the first voltage to the selected word line;

means for selecting a first bit line in response to a column address signal; and means for supplying the first voltage to the plurality of first bit lines, supplying the second voltage to at least one of first bit lines adjacent to the selected first bit line associated with the selected word line, and sensing data stored in a memory cell corresponding to the selected word line and first bit line during a reading operation.

11. The NOR type semiconductor memory device according to claim 10 wherein the first voltage is equal to or less than a power threshold voltage level, the power threshold voltage level is equal to the power supply voltage minus a threshold voltage of any of the NMOS transistors of the plurality of first and second NMOS transistors.

12. The NOR type semiconductor memory device according to claim 10 wherein the predetermined voltage range varies from a ground potential.

13. The NOR type semiconductor memory device according to claim 10 wherein a first level of the second voltage is ground potential, a second level thereof is between a (V1-Vth3) voltage and a (V1-Vth2) voltage, and a third level thereof is between the (V1-Vth2) and a voltage (V1-Vth1), where V1 is the first voltage, V2 is the second voltage, Vth1 is the first threshold voltage, Vth2 is the second threshold voltage, and Vth3 is the third threshold voltage, and wherein V2 is greater than V1 and less than a third voltage V3.

14. A method for reading data stored in a NOR type semiconductor memory device, the memory device comprising a plurality of sub-bit lines, a plurality of word lines, a plurality of main bit lines, a cell array having a plurality of banks, each bank having a plurality of memory cells connected in parallel between the sub-bit lines, a plurality of first NMOS transistors for selecting even-numbered banks, a plurality of second NMOS transistors for selecting odd-numbered banks, a voltage generating circuit for generating a first voltage by dividing an externally applied power supply voltage, a row selecting circuit for selecting one of the word lines in response to an external row address signal, a column selecting circuit for selecting a main bit line in response to an external column address signal, and a sense amplifier circuit for sensing the data stored in a memory cell associated with the selected word line and the selected main bit line, the method comprising:

precharging the main bit lines to the first voltage; and sensing the data stored in the memory cell associated with the selected word line and the selected main bit line by providing the first voltage to the plurality of main bit lines and the selected word line and providing a second voltage to at least one of the main bit lines adjacent to the selected main bit line in response to the column address signal.

15. A method for reading data stored in a NOR type semiconductor memory device, the memory device comprising a plurality of sub-bit lines, a plurality of word lines, a plurality of main bit lines, a cell array having a plurality of banks, each bank having a plurality of memory cells connected in parallel between the sub-bit lines, a plurality of first NMOS transistors for selecting even-numbered banks, a plurality of second NMOS transistors for selecting odd-numbered banks, a voltage generating circuit for generating a first voltage by dividing an externally applied power supply voltage, a row selecting circuit for selecting one of the word lines in response to an external row address signal, a column selecting circuit for selecting a main bit line in response to an external column address signal, and a sense amplifier circuit for sensing the data stored in a memory cell associated with the selected word line and the selected main bit line, the method comprising:

precharging the main bit lines to the first voltage; and sensing the data stored in the memory cell associated with the selected word line and the selected main bit line by providing the first voltage to the plurality of main bit lines and the selected word line and providing a second voltage to at least one of the main bit lines adjacent to the selected main bit line in response to the column address signal;

wherein the first voltage is equal to or less than a voltage obtained by subtracting a threshold voltage of each of the plurality of first and second NMOS transistors from the power supply voltage.

16. The method according to claim 15 wherein the second voltage is equal to ground potential.

17. The method according to claim 15 the method comprising reading multi-bit data stored in each of the plurality of memory cells having one of the first, second, third, or fourth threshold voltage indicative of the first, second, third, or fourth operating states, respectively, by repeating the precharging and sensing steps at least three times.

18. The method according to claim 17 wherein the memory device comprises a means for generating a third voltage, the third voltage having at least three voltage levels, a first voltage level of the third voltage is equal to ground potential, a second level thereof is between a (V1-Vth3) voltage and a (V1-Vth2) voltage, and a third level thereof is between the (V1-Vth2) voltage and a (V1-Vth1) voltage, V1 is equal to the first voltage, V2 is equal to the second voltage, V3 is equal to the third voltage, Vth1 is the first threshold voltage, Vth2 is the second threshold voltage, and Vth3 is the third threshold voltage, and wherein V2 is greater than V1 and less than V3.

* * * * *

UNITED STATES PATENT AND TRADEMARK OFFICE
CERTIFICATE OF CORRECTION

PATENT NO.     : 6,028,813
DATED          : February 22, 2000
INVENTOR(S)    : Choi It is certified that error appears in the above-identified patent and that said Letters Patent is hereby corrected as shown below:

Title page,
Item [57], ABSTRACT,

*REPLACE WITH THE FOLLOWING* --Disclosed are a semiconductor memory device and a method for reading data stored therein. The device comprises a cell array having a plurality of banks of memory cells, sub-bit lines, word lines, and main bit lines. Each of the banks of memory cells comprises memory cells connected in parallel between the sub bit lines. First NMOS transistors select even-numbered banks and second NMOS transistors select odd-numbered banks. A voltage generating circuit generates a first voltage by dividing an externally applied power supply voltage further comprise the device. A row selecting circuit selects one of the word lines in response to an external row address signal, a column selecting circuit selects a column of the cell array in response to an external column address signal, and a sense amplifier circuit senses the data of memory cell associated with the selected word line and the selected main bit line are also included in the device. The method for reading data stored in the semiconductor memory device comprises precharging the main bit lines to a first voltage and sensing the data stored in a memory cell associated to the selected word line and the selected main bit line by supplying the first voltage to the main bit lines and the selected word line and supplying a second voltage to at least one of the main bit lines adjacent to the selected main bit line in response to the column address signal. The voltage applied to the selected word line during a data sensing operation is equal to the voltage applied on all the main bit lines during bit line precharge operation. Alternatively, the voltage level applied to the selected word line is lower than the voltage level applied to the main bit lines. Thus, a voltage difference between respective gates and sources of the cells adjacent to the selected memory cell is 0V such that all of the cells are turned off during the data sensing period.--

Column 13,
Line 5, "I" should read -- 1 --.
Line 42, "MNL1" should read -- MBL1 --.

Column 14,
Line 67, "MRLi-1" should read -- MBLi-1 --.

Signed and Sealed this

Eleventh Day of March, 2003

JAMES E. ROGAN
*Director of the United States Patent and Trademark Office*